United States Patent
Taguchi et al.

(10) Patent No.: US 8,836,361 B2
(45) Date of Patent: Sep. 16, 2014

(54) WIRING BOARD AND PROBE CARD USING THE SAME

(71) Applicant: KYOCERA SLC Technologies Corporation, Yasu (JP)

(72) Inventors: Takayuki Taguchi, Hikone (JP); Kenji Terada, Moriyama (JP)

(73) Assignee: KYOCERA SLC Technologies Corporation, Yasu-shi, Shiga (JP)

( * ) Notice: Subject to any disclaimer, the term of this patent is extended or adjusted under 35 U.S.C. 154(b) by 87 days.

(21) Appl. No.: 13/774,851

(22) Filed: Feb. 22, 2013

(65) Prior Publication Data

US 2013/0222003 A1    Aug. 29, 2013

(30) Foreign Application Priority Data

Feb. 23, 2012   (JP) ................. 2012-037218

(51) Int. Cl.
*G01R 31/20* (2006.01)
*G01R 1/073* (2006.01)

(52) U.S. Cl.
CPC ........ *G01R 1/07342* (2013.01); *G01R 1/07378* (2013.01); *G01R 1/07314* (2013.01)
USPC ..................................... 324/754.11

(58) Field of Classification Search
USPC ............. 324/754.11, 756.03, 762.02, 762.01, 324/765, 755.01–755.11, 754.04; 174/255–256
See application file for complete search history.

(56) References Cited

U.S. PATENT DOCUMENTS

2011/0316576 A1* 12/2011 Kataoka et al. .......... 324/756.03
2012/0319711 A1* 12/2012 Hung et al. .............. 324/750.16

FOREIGN PATENT DOCUMENTS

| JP | 2004-069692 A | 3/2004 |
| JP | 4084255 B2 | 2/2008 |

* cited by examiner

*Primary Examiner* — Melissa Koval
*Assistant Examiner* — Trung Nguyen
(74) *Attorney, Agent, or Firm* — Procopio, Cory, Hargreaves & Savitch LLP

(57) ABSTRACT

A wiring board and a probe card using the wiring board which respond to a demand for improving electrical reliability.

7 Claims, 3 Drawing Sheets

WIRING BOARD AND PROBE CARD USING THE SAME

BACKGROUND OF THE INVENTION (1) Field of the Invention

The present invention relates to a wiring board and a probe card using the same which are used for a semiconductor wafer inspection apparatus and the like.

(2) Description of Related Art

Conventionally, in a semiconductor wafer inspection apparatus, a probe card is used for inspecting the electrical reliability of a semiconductor wafer.

For example, Japanese Unexamined Patent Application Publication No. 2004-69692 describes a probe card including a core layer; a buildup wiring layer formed on the core layer and including a plurality of wirings; and a plurality of probe pins which are fitted to electrodes on a topmost surface of the buildup wiring layer and are individually connected to the wirings of the buildup wiring layer, in which wirings in the vicinity of the probe pins include inner vias. Referring to FIG. 4 of Japanese Unexamined Patent Application Publication No. 2004-69692, since the probe card are wired in the buildup wiring layer, the number of inner vias arranged immediately below the electrodes to which the probe pins are fitted are different for each of the electrodes.

When the probe card is used, and the probe pin is brought into contact with an electrode pad of a semiconductor chip, an electrode on a topmost surface of the buildup wiring layer is pressed by the probe pin. As a result, when the probe card is repeatedly used, an insulating resin layer deforms, and the electrode may sink into the buildup wiring layer.

In such a case, as described above, if the number of inner vias arranged immediately below the electrode to which the probe pin is fitted is different for each of the electrodes, amounts of the insulating resin layers individually located immediately below the electrodes vary from one another. Therefore, an amount of sinking of the electrode into the buildup wiring layer varies for each of the electrodes.

As a result, when the electrode is pushed by the probe pin, a force applied to the electrode having a small amount of sinking increases, which tends to cause breakage of wirings of the buildup wiring layer, and eventually tends to reduce the electrical reliability of the probe card.

SUMMARY OF THE INVENTION

It is an object of the present invention to provide a wiring board and a probe card using the same which respond to a demand for improving electrical reliability.

A wiring board according to the present invention includes a core substrate and a buildup layer formed on the core substrate. The buildup layer includes: a plurality of resin layers laminated on the core substrate; a plurality of pads formed on a topmost layer of the resin layers and to which a plurality of probes are respectively connected; a plurality of wiring conductors formed on either the resin layers or the core substrate and electrically connecting the plurality of pads individually through to an external circuit; a via conductor penetrating the resin layer in a thickness direction thereof and electrically connecting the pad and the wiring conductor together; and a dummy via conductor penetrating through the resin layer in the thickness direction thereof without electrically connecting the pad and the wiring conductor together. The via conductor and the dummy via conductor are arranged immediately below each of the pads; the pads include a first pad with at least one of the dummy via conductors arranged immediately therebelow, and a second pad with only the via conductor arranged immediately therebelow; and a total amount of the dummy via conductors and an amount of the via conductors formed immediately below the first pad is equal to a quantity of the via conductors formed immediately below the second pad.

Further, a probe card according to the present invention includes the wiring board described above, and the plurality of probes individually connected to the plurality of pads.

According to the wiring board of the present invention, the buildup layer includes at least one via conductor that penetrates through the resin layer in a thickness direction thereof immediately below the pad and electrically connects the pad and the wiring conductor together, and at least one dummy via conductor that penetrates through the resin layer in a thickness direction thereof immediately below the pad and does not electrically connect the pad and the wiring conductor. Accordingly, an amount of sinking of each pad with respect to the buildup layer can be made adjustable by the dummy via conductor, and the amount of sinking of each pad can be uniformalized. Consequently, it is possible to reduce breakage of the wiring conductor, and eventually obtain a wiring board excellent in the electrical reliability.

DETAILED DESCRIPTION OF EXEMPLARY EMBODIMENTS

First Embodiment

Probe Card

Hereinafter, a probe card using a wiring board according to a first embodiment of the present invention will be described in detail with reference to the drawings.

Figure 1A:
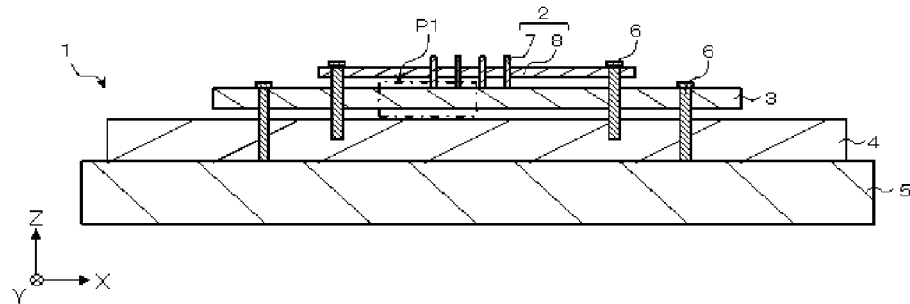
FIG. 1(a) is a cross sectional view taken along a thickness direction of a probe card according to a first embodiment of the present invention.

A probe card 1 illustrated in FIG. 1(a) is used to inspect electrical reliability of a semiconductor wafer by means of a signal from a measurement instrument (not illustrated) such as a tester in a semiconductor wafer inspection apparatus. The probe card 1 includes a probe head 2, a wiring board 3 to which the probe head 2 is connected, a main board 4 to which the wiring board 3 is connected, a reinforcement board 5 to which the main board 4 is connected, and screws 6 for connecting individual members together.

The probe head 2 is used to inspect the semiconductor wafer. The probe head 2 includes a plurality of probes 7 and a holding member 8 for holding the probes 7. The probes 7 are terminals to be brought into contact with electrodes of the semiconductor wafer, and have a function of transmitting an electric signal or a power voltage between the wiring board 3 and the semiconductor wafer and a function of connecting the semiconductor wafer to a ground potential through the wiring board 3. The probes 7 are arranged according to a wiring pattern of the semiconductor wafer to be inspected, and intervals among the individual proves 7 are set, for example, to 40 μm or larger and 110 μm or smaller. In this embodiment, the probes 7 penetrate through the holding member 8 in a thickness direction thereof. One ends of the probes 7 are brought into contact with the electrodes of the semiconductor wafer, the probes 7 are pressed against the wiring board 3, and other ends of the probes 7 make contact with pads 21 of the wiring board 3 which will be described later. As a result, the electrodes of the semiconductor wafer and the pads 21 are electrically connected together.

The wiring board 3 functions as a holding member of the probe head 2, and electrically connects the probes 7 and the main board 4 together. Wiring in a pattern according to the arrangement of the probes 7 and the electrodes of the main board 4 is formed in the wiring board 3. As the wiring board 3, the one which corresponds to the probe head 2 to be used is arbitrarily used. In addition, the wiring board 3 is fitted by screws to the main board 4 so that the wiring board 3 can be arbitrarily replaced according to the semiconductor wafer to be inspected. The wiring board 3 and the main board 4 are electrically connected together, for example, through conductive pins (not illustrated) that penetrate through the wiring board 3 in a thickness direction thereof and make contact with the electrodes of the main board 4.

The main board 4 electrically connects the measurement instrument and the wiring board 3 together. For example, a printed wiring board or the like is named as the main board 4.

The reinforcement board 5 has a function of reducing warpage of the main board 4 by reinforcing the main board 4. The reinforcement board 5 is formed of a metallic material such as stainless steel or aluminum.

The screws 6 connect the probe head 2 to the wiring board 3, and the wiring board 3 to the main board 4.

(Wiring Board)

Next, the wiring board according to the present invention will be described in detail with reference to the drawings.

Figure 1B:
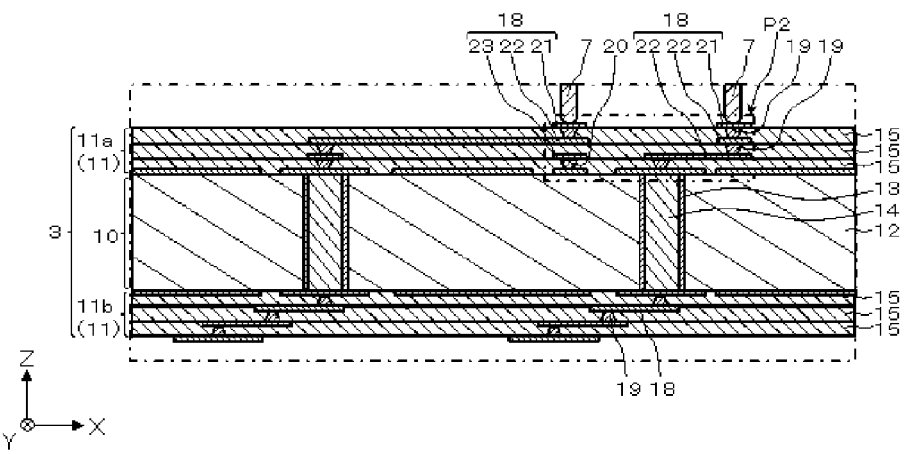
FIG. 1(b) is an enlarged cross sectional view of a portion P1 of FIG. 1(a)

The wiring board 3 illustrated in FIG. 1(b) includes a core substrate 10, and a pair of buildup layers 11 individually formed on both principal surfaces of the core substrate 10. For convenience sake, between the pair of buildup layers 11, the buildup layer 11 arranged on a side of the probe head 2 is named as a first buildup layer 11a, and the buildup layer 11 arranged on a side of the main board 4 is named as a second buildup layer 11b.

(Core Substrate)

The core substrate 10 is for increasing the strength of the wiring board 3, and includes a substrate 12 with a through-hole having a columnar shape and penetrating through the substrate 12 in a thickness direction thereof, a through-hole conductor 13 formed on an inner wall of the through-hole and having a cylindrical shape, and an insulator 14 arranged inside the through hole conductor 13 and having a columnar shape.

The substrate 12 constitutes a principal portion of the core substrate 10 and increases the rigidity thereof. The substrate 12 includes a resin such as epoxy resin in which an inorganic insulating filler such as a silica filler is dispersed, and a base material such as glass cloth covered with the resin. A thickness of the substrate 12 is set, for example, to 0.1 mm or larger and 1 mm or smaller. A coefficient of thermal expansion of the substrate 12 in a planar direction thereof is set, for example, to 5 ppm/° C. or larger and 30 ppm/° C. or smaller. A coefficient of thermal expansion of the substrate 12 in a thickness direction thereof is set, for example, to 15 ppm/° C. or larger and 50 ppm/° C. or smaller. The Young's modulus of the substrate 12 is set, for example, to 5 GPa or larger and 30 GPa or smaller.

The coefficient of thermal expansion of the substrate 12 is measured according to the measurement method complying with JISK7197-1991 using a commercially available TMA apparatus. The Young's modulus of the substrate 12 is measured using Nano Indenter XP/DCM manufactured by MTS Systems Co. A coefficient of thermal expansion and a Young's modulus of each member are measured in a similar way as applied to the substrate 12.

The through hole conductor 13 is to electrically connect the buildup layers 11 formed on the both principal surfaces of the core substrate 10 together. The through-hole conductor 13 is formed of a conductive material such as copper, titanium, molybdenum, chrome, or a nickel chrome alloy.

The through hole conductor 13 is adhered to the inner wall of the through hole having a columnar shape and penetrating through the substrate 12 in a thickness direction thereof. A diameter of the through hole is set, for example, to 50 μm or larger and 250 μm or smaller.

The insulator 14 forms a support surface of a via conductor 19 which will be described later. The insulator 14 is formed of a resin material such as epoxy resin.

(Buildup Layer)

Figure 1C:
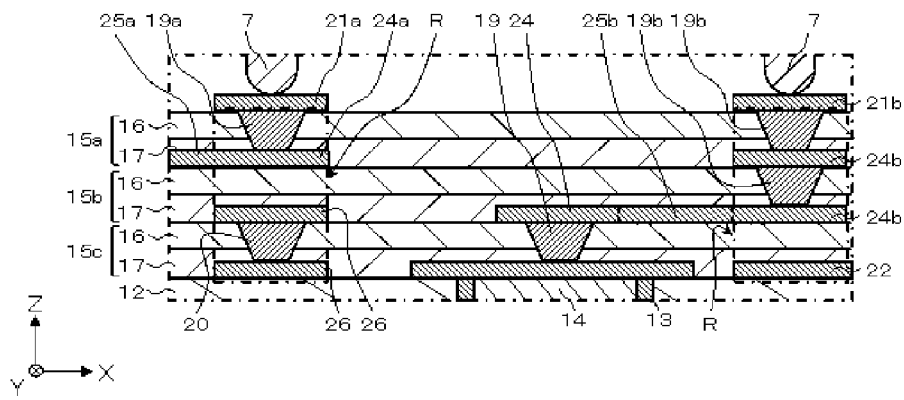
FIG. 1(c) is an enlarged cross sectional view of a portion P2 of FIG. 1(b)

In addition, as described above, the pair of buildup layers 11 are individually formed on the both principal surfaces of the core substrate 10. As illustrated in FIGS. 1(b) and 1(c), each of the buildup layers 11 includes a plurality of resin layers 15 laminated together on the core substrate 10, a plurality of conductive layers 18 partially formed on the substrate 12 and the resin layers 15, a plurality of via conductors 19 individually penetrating through the resin layers 15 in a thickness direction thereof, and a dummy via conductor 20 penetrating through the resin layer 15 in a thickness direction thereof.

The resin layers 15 not only function as a support member for supporting the conductive layers 18, but also function as an insulating member for preventing the conductive layers 18 from establishing a short circuit therebetween. As illustrated in FIG. 1(c), each of the resin layers 15 includes a film layer 16 and an adhesive layer 17 arranged closer toward a side of the core substrate 10 than the film layer 16. A thickness of the resin layer 15 is set, for example, to 5 μm or larger and 40 μm or smaller. Each of the buildup layers 11 of the wiring board illustrated in FIGS. 1(b) and 1(c) includes three layers of the resin layers 15.

The film layer 16 increases rigidity of the resin layer 15, and reduces a coefficient of thermal expansion thereof in a planar direction. The film layer 16 includes a film-shaped resin containing an inorganic insulating filler such as a silica filler. Examples of the resin include a thermoplastic resin such as polyimide resin. In view of reducing the coefficient of thermal expansion of the film-shaped resin in a planar direction thereof, it is preferable that it have a structure in which a longer direction of each resin molecular chain is parallel to a planar direction of the film layer 16.

A coefficient of thermal expansion of the film layer 16 in a planar direction thereof is set, for example, to 0 ppm/° C. or larger and to 30 ppm/° C. or smaller. A coefficient of thermal expansion of the film layer 16 in a thickness direction thereof is set, for example, to 20 ppm/° C. or larger and 50 ppm/° C. or smaller. A Young's modulus of the film layer 16 is set, for example, 2.5 GPa or larger and 10 GPa or smaller. The film layer 16 has the Young's modulus which is larger than that of the adhesive layer 17, and the coefficient of thermal expansion thereof in a planar direction which is set smaller than that of the adhesive layer 17. As a result of this, it is possible to increase the rigidity of the resin layer 15 and reduce the coefficient of thermal expansion thereof in a planar direction.

The adhesive layer 17 adheres the film layers 16 adjacent to each other in a thickness direction thereof together, and is adhered on a side surface and one principal surface of the conductive layer 18 so as to fix the conductive layer 18. The adhesive layer 17 contains a resin, and examples of the resin include epoxy resin, bismaleimide triazine resin, cyanate resin, amide resin, or the like. Although it is preferable that the adhesive layer 17 should not contain an inorganic insulating filler in view of adhesion, it may include the inorganic insulating filler.

Coefficients of thermal expansions of the adhesive layer 17 in a planar direction and in a thickness direction are set, for example, to 10 ppm/° C. or larger and 100 ppm/° C. or smaller. The coefficient of thermal expansion of the adhesive layer 17 in the planar direction is set, for example, to 2 times or more and 100 times or less the coefficient of thermal expansion of the film layer 16 in a planar direction. A Young's modulus of the adhesive layer 17 is set, for example, to 0.05 GPa or larger and 0.5 GPa or smaller, and is set, for example, to 0.0005 times or more and 0.2 times or less the Young's modulus of the film layer 16. The Young's modulus of the adhesive layer 17 is set smaller than that of the film layer 16. As a result, it is possible to increase adhesion strengths between the adhesion layer 17 and the film layer 16, and between the adhesion layer 17 and the conductive layer 18.

The conductive layer 18 is formed of a conductive material such as copper, titanium, molybdenum, chrome, or a nickel chrome alloy. It is preferable that the conductive layer 18 include a base film made of a nickel chrome alloy, and a conductor portion made of copper which is provided on the base film. As a result of this, it is possible to increase the adhesion strength between the conductive layer 18 and the film layer 16 by the base film, and at the same time increase conductivity of the conductive layer 18 by the conductor portion.

A thickness of the conductive layer 18 is set, for example, to 3 μm or larger and 20 μm or smaller. A coefficient of thermal expansion of the conductive layer 18 is set, for example, to 16.5 ppm/° C. or larger and 17.5 ppm/° C. or smaller. A Young's modulus of the conductive layer 18 is set, for example, to 110 GPa or larger and 128 GPa or smaller. The Young's modulus of the conductive layer 18 is larger than the Young's moduli of the film layer 16 and the adhesive layer 17.

A part of the conductive layer 18 forms at least one of a plurality of pads 21 formed on the resin layer 15 positioned in a topmost layer (an outermost layer on a side opposite to the core substrate 10) of the first buildup layer 11a; a plurality of wiring layers 22 which are formed on the resin layer 15 or on the substrate 12 and electrically connect the plurality of pads 21 individually to an external circuit (main board 4); and a dummy wiring layer 23 which is formed on the resin layer 15 or on a substrate 12 and does not electrically connect the plurality of pads 21 individually to the external circuit. The via conductors 19 which will be described later, the pads 21, and the wiring layers 22 constitute an electric circuit between the probe 7 and the external circuit, and function as a ground wire, a power supply wire, or a signal wire.

The pads 21 form a part of an electric circuit that electrically connects the probe 7 and the external circuit together. When the pads 21 and the probe 7 make contact with each other, the wiring layer 22 and the probe 7 are electrically connected together. The pad 21 is formed, for example, in a disk shape, a width of the pad 21 is set, for example, to 25 μm or larger and 50 μm or smaller, and a thickness of the pad 21 is preferably set to 5 μm or larger and 10 μm or smaller.

The wiring layer 22 forms a part of an electric circuit that electrically connects the probe 7 and the external circuit together. The wiring layer 22 includes a land 24 whose principal surface is connected to an end portion of the via conductor 19, and a wiring conductor 25 connected to the land 24.

The land 24 has a function of connecting the via conductor 19 and the wiring conductor 25 together and converting a current flowing direction to either a thickness direction (Z-direction) or a planar direction (XY planar direction), or a function of connecting the via conductors 19 adjacent to each other in a thickness direction together and allowing a current to flow in a thickness direction. The land 24 has one principal surface thereof connected to the via conductor 19 and a side surface thereof connected to the wiring conductor 25, or has two principal surfaces thereof individually connected to the via conductors 19. The land 24 is formed, for example, in a disk shape, and preferably has the same shape as that of the pad 21. In the case where the land 24 has the same shape as the pad 21, a tolerance of a thickness or a width with respect to that of the pad 21 is set within ±20%. The land 24 may be formed in a solid shape.

The wiring conductor 25 is formed on the resin layer 15 or on the substrate 12 along a planar direction and has a function of conducting electricity in a planar direction. The wiring conductor 25 electrically connects the lands 24 together by being connected to both the pair of lands 24 positioned on the same layer. The wiring conductor 25 is formed, for example, linearly or solidly in a plan view. It is preferable that the wiring conductor 25 have the same thickness as that of the land 24, and, in such a case, a tolerance of the thickness with respect to that of the land 24 is set within ±20%.

The dummy wiring layer 23 does not constitute a part of an electric circuit that electrically connects the probe 7 and the external circuit together, and is connected to the dummy via conductor 20. The dummy wiring layer 23 includes a dummy land 26 whose principal surface is connected to an end portion of the dummy via conductor 20. The dummy land 26 is formed, for example, in a disk shape. It is preferable that the dummy land 26 have the same shape as that of the land 24, and, in such a case, a tolerance of the thickness or the width with respect to that of the land 24 is set within ±20%. In this embodiment, the dummy wiring layer 23 is formed only in the first buildup layer 11a between the pair of buildup layers 11. Further, the dummy wiring layer 23 may includes a linear or solid dummy wiring conductor in a plan view which is connected to a side surface of the dummy land 26.

In contrast, the via conductor 19 constitutes a part of an electric circuit that electrically connects the probe 7 and the external circuit together. The via conductor 19 electrically connects the lands 24 that are distanced in a thickness direction together, or the land 24 and the pad 21 together, and conducts electricity in a thickness direction. The via conductor 19 can be formed of the same metallic material as that for the conductive layer 18, and preferably includes a base film and a conductor portion similar to those of the conductive layer 18.

The via conductor 19 has, for example, a tapered shape with a width thereof narrowing toward the core substrate 10 and upper and lower surfaces thereof in a circular shape. A maximum width (width of the upper surface) of the via conductor 19 is set, for example, to 20 μm or larger and 50 μm or smaller. A minimum width (width of the lower surface) of the via conductor 19 is set, for example, 10 μm or larger and 40 μm or smaller. A coefficient of thermal expansion and a Young's modulus of the via conductor 19 are set in the same manner as those of the conductive layer 18, and the Young's modulus of the via conductor 19 is larger than the Young's modulus of the film layer 16 and the adhesive layer 17.

The dummy via conductor 20 does not constitute a part of an electric circuit that electrically connects the probe 7 and the external circuit together, and is not electrically connected to the pad 21. The dummy via conductor 20 has, for example, a tapered shape with a width thereof narrowing toward the core substrate 10 and upper and lower surfaces thereof in a circular shape. It is preferable that the dummy via conductor 20 has the same shape as that of the via conductor 19, and, in such a case, a tolerance of the thickness or the width with respect to that of the via conductor 19 is set within ±20%. In this embodiment, although the dummy via conductor 20 is formed only in the first buildup layer 11a between the pair of buildup layers 11, it may be formed in the second buildup layer 11b.

For convenience sake, among the three layers of the resin layers 15 that constitute the first buildup layer 11a, the resin layer 15 forming a topmost layer (outermost layer on a side of the probe 7) is named as a first resin layer 15a, the resin layer 15 forming an intermediate layer (layer that is adjacent to the first resin layer 15a on a side of the core substrate 10) is named as a second resin layer 15b, and the resin layer 15 forming a lowermost layer (outermost layer on a side of the core substrate 10) is named as a third resin layer 15c.

Among the plurality of pads 21, the pad 21 with at least one dummy via conductor arranged immediately therebelow is named as a first pad 21a, and the pad 21 with only a via conductor arranged immediately therebelow is named as a second pad 21b. As illustrated in FIG. 1(c), in this embodiment, although the first pad 21a and the second pad 21b are adjacent to each other, they may not be adjacent to each other.

Among the plurality of wiring conductors 25, the wiring conductor 25 electrically connected to the first pad 21a is named as a first wiring conductor 25a, and the wiring conductor 25 electrically connected to the second pad 21b is named as a second wiring conductor 25b. As illustrated in FIG. 1(c), in this embodiment, the first wiring conductor 25a is positioned on the second resin layer 15b (between the first resin layer 15a and the second resin layer 15b), and the second wiring conductor 25b is positioned on the third resin layer 15c (between the second resin layer 15b and the third resin layer 15c). This means that the first wiring conductor 25a and the second wiring conductor 25b are located in different layers.

Among the plurality of via conductors 19, the via conductor 19 arranged immediately below the first pad 21a and electrically connected to the first pad 21a is named as a first via conductor 19a, and the via conductor 19 arranged immediately below the second pad 21b and electrically connected to the second pad 21b is named as a second via conductor 19b. As illustrated in FIG. 1(c), in this embodiment, a single first via conductor 19a is formed immediately below the first pad 21a, and penetrates through the first resin layer 15a in a thickness direction thereof. Two second via conductors 19b are formed immediately below the second pad 21b, and each of the second via conductors 19b penetrates through either the first resin layer 15a or the second resin layer 15b in a thickness direction thereof. This means that the number of the first via conductors 19a is smaller than the number of the second via conductors 19b. This is because the first wiring conductor 25a is positioned closer to a side of the uppermost layer (side of the probe 7) than the second wiring conductor 25b is.

The position of immediately below the pad 21 in this specification means, as illustrated in FIG. 1(c), a passing region R through which the pad 21 is moved toward the core substrate 10 in a shortest distance in a cross section along a thickness direction (Z-direction) of the wiring board 3.

Further, among the plurality of lands 24, the land 24 arranged immediately below the first pad 21a and connected to an end portion of the first via conductor 19a is named as a first land 24a, and the land 24 arranged immediately below the second pad 21b and connected to an end portion of the second via conductor 19b is named as a second land 24b. As illustrated in FIG. 1(c), in this embodiment, a single layer of the first land 24a is formed immediately below the first pad 21a, and two layers of the second lands 24b are formed immediately below the second pad 21b. Although the second land 24b is not formed between the substrate 12 and the third resin layer 15c immediately below the second pad 21b, a single layer of the wiring layer 22 is formed therein. Accordingly, the single layer of the wiring layer 22 (first land 24a) is formed immediately below the first bad 21a, and three layers of the wiring layers 22 (wiring layer 22 and two layers of the second lands 24b) are formed immediately below the second pad 21b. This means that the number of wiring layers 22 positioned immediately below the first pad 21a is smaller than the number of wiring layers 22 positioned immediately below the second pad 21b.

When the probe card 1 is used, the pad 21 is repeatedly pressed against the first buildup layer 11a by the probe 7. As a result, if the resin layer 15 is arranged immediately below the pad 21, the pad 21 may sink into the first buildup layer 11a by deformation of the resin layer 15. In particular, the adhesive layer 17 having the Young's modulus smaller than that of the film layer 16 tends to be deformed. In such a case, if an amount of the resin layer 15 arranged immediately below each of the pads 21 varies, an amount of sinking tends to become non-uniform. Since the substrate 12 has a large Young's modulus and a large thickness, and therefore is difficult to be deformed, the deformation tends to be caused in the first buildup layer 11a rather than in the second buildup layer 11b.

In view of this, in this embodiment, the dummy via conductor 20 is formed immediately below the first pad 21a. As a result, it is possible to reduce the difference between an amount of the resin layer 15 arranged immediately below the first pad 21a and an amount of the resin layer 15 positioned immediately below the second pad 21b. Accordingly, in the case where the first pad 21a and the second pad 21b are repeatedly pressed individually by the probe 7, it is possible to reduce the difference between an amount of sinking of the first pad 21a with respect to the first buildup layer 11a and an amount of sinking of the second pad 21b with respect to the first buildup layer 11a.

This means that the dummy via conductor 20 makes it possible to adjust the amount of sinking of the first pad 21a with respect to the first buildup layer 11a, and therefore the amounts of sinking of the first pad 21a and the second pad 21b can be further uniformalized. Since stress concentration on the wiring conductor 25 positioned in the vicinity of one of the pads 21 can be reduced when the pad 21 is pressed by the probe 7, breakage of the wiring conductor 25 can be reduced, and eventually the wiring board 3 excellent in the electrical reliability can be obtained.

In addition, since the amounts of sinking of the first pad 21a and the second pad 21b can be further uniformalized, poor contact between the probe 7 and the pad 21 can be reduced when the probe 7 is brought into contact with the pad 21.

One of the dummy via conductors 20 is formed immediately below the first pad 21a, but the dummy via conductor 20 is not formed immediately below the second pad 21b. As a result, a total (two) of the numbers (one) of the first via conductor 19a and the number (one) of dummy via conductors 20 positioned immediately below the first pad 21a becomes equal to a total (two) of the number (two) of the second via conductors 19b and the number (none) of the dummy via conductors 20 positioned immediately below the second pad 21b.

It is preferable that, in all of the pads 21, the total of the number of the via conductors 19 and the number of the dummy conductors 20 positioned immediately below the pad 21 coincide with each another. As a result, the amounts of sinking with respect to the buildup layers 11 for all of the pads 21 can be uniformalized.

The dummy via conductor 20 penetrates through the third resin layer 15c in a thickness direction thereof immediately below the first bad 21a, and is distanced from the first via conductor 19a which penetrates through the first resin layer 15a in a thickness direction thereof immediately below the first pad 21a with the second resin layer 15b interposed therebetween.

As illustrated in FIG. 1(c), as to the via conductor 19 and the dummy via conductor 20 positioned immediately below the pad 21, it is preferable that the via conductor 19 and the dummy via conductor 20 individually in its entirety be positioned immediately below the pad 21 in a cross section along a thickness direction of the wiring board 3.

In this embodiment, the dummy land 26 whose principal surface is connected to the end portion of the dummy via conductor 20 is formed immediately below the first pad 21a. As a result, a difference between the amount of the resin layer 15 arranged immediately below the first pad 21a and the amount of the resin layer 15 arranged immediately below the second pad 21b can be excellently reduced by the dummy land 26. In particular, since the dummy land 26 is buried in the adhesive layer 17, an amount of the adhesive layer 17 immediately below each of the pads 21 can be adjusted by the dummy land 26. Accordingly, since the amount of the adhesive layer 17 which is more easily deformed than the film layer 16 can be adjusted, the amounts of sinking of the individual pads 21 can be further uniformalized.

A single layer of the dummy land 26 is formed on each side of the dummy via conductor 20 immediately below the first pad 21a. As a result, a total (three layers) of the number (one layer) of layers of the wiring layers 22 and the number (two layers) of layers of the dummy wiring layers 23 positioned immediately below the first pad 21a is equal to a total (three layers) of the number (three layers) of wiring layers 22 and the number (none) of dummy wiring layers 23 positioned immediately below the second pad 21b. Accordingly, the amounts of the resin layers 15 positioned immediately below the individual pads 21 can be further uniformalized.

As described above, thicknesses of the land 24, the wiring conductor 25, and the dummy land 26 are set to substantially the same value. As a result, the amounts of the resin layers 15 positioned immediately below the individual pads 21 can be further uniformalized.

Further, as to the dummy lands 26 positioned immediately below the pad 21, as illustrated in FIG. 1(c), it is preferable that the dummy lands 26 individually in its entirety be positioned immediately below the pad 21 in a cross section along a thickness direction of the wiring board 3.

In this way, a signal is sequentially transmitted to the main board 4, the wiring board 3, and the probe head 2. As a result, the probe card 1 illustrated in FIG. 1(a) can conduct a signal of the measurement instrument connected to the main board 4 to the semiconductor wafer which makes contact with the probe 7 of the probe head 2. Further, the probe card 1 can conduct a signal of the semiconductor wafer to the measurement instrument by conducting the signal in a reverse direction. As a result, the probe card 1 makes the inspection of the electrical reliability of the semiconductor wafer possible, and exerts a desired function.

(Manufacturing Method of the Probe Card)

Next, a manufacturing method of the probe card 1 described above will be described with reference to FIG. 2.

Figure 2A:
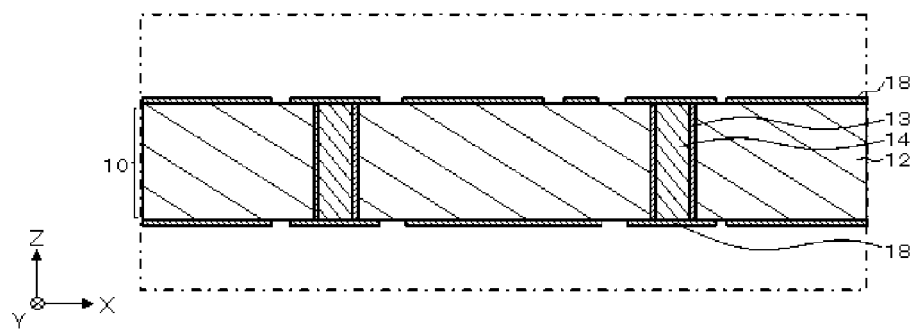
FIGS. 2(a) and 2(b) are enlarged cross sectional views corresponding to a portion illustrated in FIG. 1(b) for explaining a manufacturing process of the probe card illustrated in FIG. 1(a)

As illustrated in FIG. 2(a), the core substrate 10 having the conductive layers 18 formed on both principal surfaces will be prepared. This is perfomed specifically in the following manner.

(1) First, for example, a plurality of uncured resin sheets are laminated together, copper foil is laminated on an outermost layer, and the laminated body is heated and pressurized for curing to thereby prepare the substrate 12. The uncured state is a state of A-stage or B-stage complying with ISO472: 1999. Next, through holes penetrating through the substrate 12 in a thickness direction thereof are formed by, for example, drilling, laser processing, or the like. Then, a conductive material is adhered onto the inner wall of the through hole, for example, by the non-electroplating method, the electroplating method, and the like to thereby form the through hole conductor 13. Thereafter, a resin or the like is filled inside the through hole conductor 13 to form the insulator 14. Next, after the conductive material is adhered to an exposed portion of the insulator 14, the copper foil is subjected to patterning into a desired shape by the conventionally well-known photolithography method, etching method, or the like to thereby form the conductive layer 18.

(Production of Wiring Board)

Figure 2B:
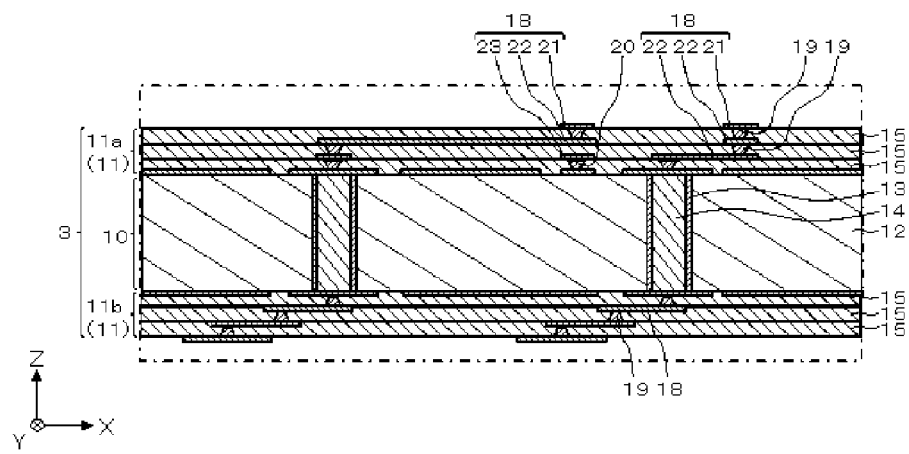

(2) As illustrated in FIG. 2(b), the pair of buildup layers 11 are formed on both principal surfaces of the core substrate 10 to thereby prepare the wiring board 3. This is perfomed specifically in the following manner.

First, the film layer 16 is arranged on the core substrate 10 with an uncured adhesive layer 17 interposed therebetween, the adhesive layer 17 is cured by heating and pressurizing the core substrate 10, the adhesive layer 17, and the film layer 16, and thereby the resin layer 15 is formed on the core substrate 10. Next, the via hole is formed in a desired position of the resin layer 15 by performing laser processing using, for example, a YAG laser device, a carbon dioxide laser device, or the like, so that at least a part of the conductive layer 18 is exposed in the via hole. Then, the base film is formed on the resin layer 15 and on the inner surface of the via hole using the sputtering method. Thereafter, after forming a resist subjected to patterning of a desired shape on the base film using the photolithography method, the conductor portion is partially formed on the base film using the electroplating method. Subsequently, after removing the resist from the base film, an area where the conductor portion is not formed on the base film is removed using the etching method, and the conductive layer 18, the via conductor 19, and the dummy via conductor 20 are formed.

The wiring board 3 can be produced by forming the pair of buildup layers 11 while the foregoing process is repeated.

(Preparation of Probe Card)

(3) The probe card 1 illustrated in FIG. 1(a) can be prepared by sequentially connecting the probe head 2, the wiring board 3, the main board 4, and the reinforcement board 5.

Second Embodiment

Next, a probe card including a wiring board according to a second embodiment of the present invention will be described in detail with reference to the drawings. However, descriptions of the structures similar to those of the first embodiment as described above will not be repeated.

Figure 3A:
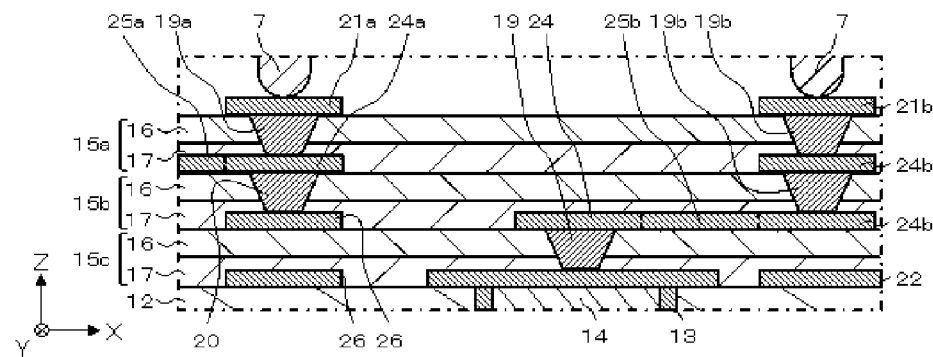
FIG. 3(a) is an enlarged cross sectional view of a probe card according to a second embodiment of the present invention, and corresponds to a portion illustrated in FIG. 1(b)

According to the second embodiment, although a second pad 21b involves a structure similar to that of the first embodiment, a first pad 21a involves a structure different from that of the first embodiment. Specifically, as illustrated in FIG. 3(a), in the second embodiment, an end portion of a dummy via conductor 20 is connected to a lower surface of a first land 24a (principal surface opposite to a side of the first pad 21a) which is connected to a side surface of a first wiring conductor 25a. Therefore, the dummy via conductor 20 is electrically connected to a first via conductor 19a through the first land 24a immediately below the first pad 21a. The dummy via conductor 20 does not constitute a part of a path through which a current between a first wiring conductor 25a and the first pad 21a flows, and therefore does not electrically connect the first wiring conductor 25a and the first pad 21a together.

In this embodiment, a dummy land 26 which is not connected to the dummy via conductor 20 is formed between a substrate 12 and a first resin layer 15c immediately below the first pad 21a. The amounts of resin layers 15 for individual pads 21 positioned immediately below the individual pads 21 can be made further uniform by means of the dummy land 26 as in the case of the first embodiment.

Third Embodiment

Next, a probe card including a wiring board according to a third embodiment of the present invention will be described in detail with reference to the drawings. However, descriptions of the structures similar to those of the first embodiment as described above will not be repeated.

Figure 3B:
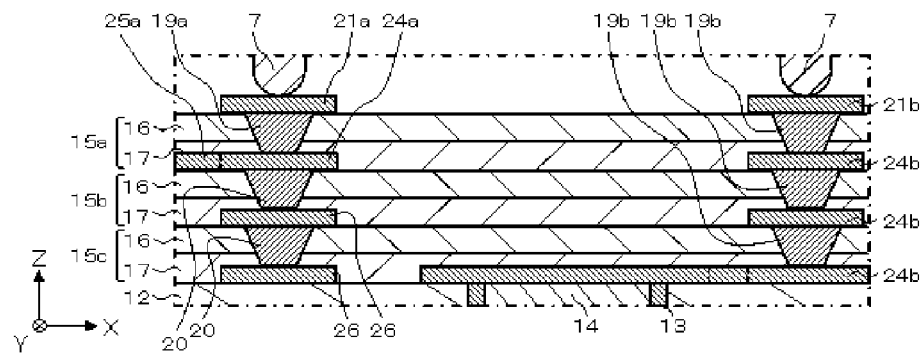
FIG. 3(b) is an enlarged cross sectional view of a probe card according to a third embodiment of the present invention, and corresponds to a portion illustrated in FIG. 1(b)

According to the third embodiment, a second pad 21b involves a structure different from that in the first embodiment. As illustrated in FIG. 3(b), in the third embodiment, second via conductors 19b are formed individually in all of three layers of the resin layers 15 immediately below the second pad 21b. That is, three second via conductors 19b are formed immediately below the second pad 21b. As a result, since an amount of the resin layer 15 immediately below the second pad 21b is small, it is possible to reduce a sinking amount of the second pad 21b with respect to a first buildup layer 11a when the second pad 21b is repeatedly pressed by a probe 7. In addition, since the second via conductors 19b form a stack structure, it is possible to shorten a path through which a current flows.

Further, according to the third embodiment, a first pad 21a also involves a structure different from that in the first embodiment. As illustrated in FIG. 3(b), in the third embodiment, either a first via conductor 19a or a dummy via conductor 20 is formed in all three layers of the resin layers 15 immediately below the first pad 21a. Specifically, one first via conductor 19a is formed, and two dummy via conductors 20 are formed immediately below the first pad 21a. As a result, it is possible to reduce a sinking amount of the first pad 21a with respect to a first buildup layer 11a as in the case of the second pad 21b described above.

Fourth Embodiment

Next, a probe card including a wiring board according to a fourth embodiment of the present invention will be described in detail with reference to the drawings. However, descriptions of the structures similar to those of the first embodiment as described above will not be repeated.

Figure 3C:
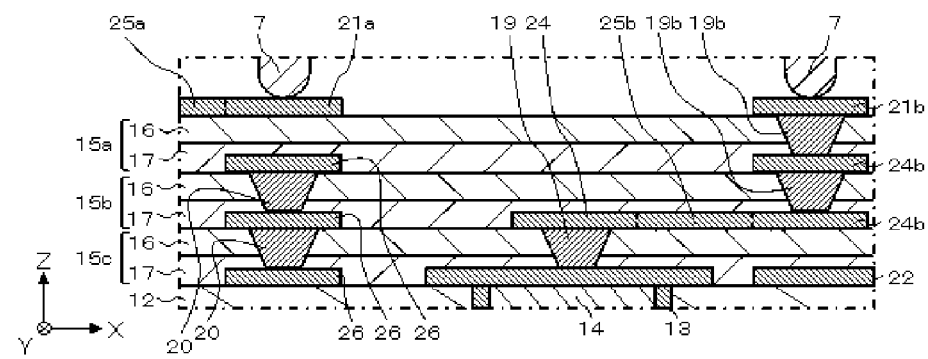
FIG. 3(c) is an enlarged cross sectional view of a probe card according to a fourth embodiment of the present invention, and corresponds to a portion illustrated in FIG. 1(b).

According to the fourth embodiment, although a second pad 21b involves a structure similar to that in the first embodiment, a first pad 21a involves a structure different from that in the first embodiment. As illustrated in FIG. 3(c), in the fourth embodiment, a first wiring conductor 25a is formed on an identical layer (topmost layer) as the first pad 21a, and is connected to a side surface of the first pad 21a. Accordingly, a first via conductor 19 is not formed immediately below the first pad 21a, but two dummy conductors 20 are formed. In this way, even in the case where the first wiring conductor 25a is formed on an identical layer as the first pad 21a, and the first via conductor 19 is not formed immediately below the first pad 21a, it is possible to adjust an amount of a resin layer 15 immediately below each of the pads 21 by the dummy conductor 20.

The present invention is not limited to the embodiments described above, and various modifications, improvements, combinations, and the like may be made within a scope without departing from the spirits of the invention.

In the embodiment described above, although an example of a configuration in which the probe card provided with the probe head, the wiring board, the main board, the reinforcement board, and the screws is described, the probe card may be provided with the wiring board and the probe, and may have a different structure.

In the embodiment described above, although an example of a configuration in which the probe is brought into contact with the pad is described, the probe and the pad may be connected to each other, and, for example, the probe and the pad may be adhered together through solder.

In the embodiment described above, although an example of a configuration in which the buildup layer is formed of three resin layers is described, two or more of the resin layers may be provided.

In the embodiment described above, although an example of a configuration in which the dummy via conductor is provided only immediately below the first pad is described, the dummy via conductor may be formed immediately below the second pad, or the dummy via conductor may be formed immediately below another pad.

In the embodiment described above, although an example of a configuration in which the resin layer is formed of the film layer and the adhesive layer is described, the resin layer may be structured differently.

In the embodiment described above, although an example of a configuration in which specific examples of arranging the via conductor and the dummy via conductor is described, at least one via conductor and one dummy via conductor may be formed immediately below the pad.

In the embodiment described above, although an example of a configuration in which the via conductor, the dummy via conductor, and the dummy land are individually positioned in its entirety immediately below the pad is described, at least individual parts of the via conductor, the dummy via conductor, and the dummy land may be positioned immediately below the pad.

What is claimed is:
1. A wiring board comprising:
 a core substrate; and
 a buildup layer formed on the core substrate,
 wherein the buildup layer includes:
  a plurality of resin layers laminated on the core substrate;
  a plurality of pads formed on a topmost layer of the resin layers and to which a plurality of probes are respectively connected;

a plurality of wiring conductors formed on either the resin layers or the core substrate and electrically connecting the plurality of pads individually to an external circuit;

a via conductor penetrating through the resin layer in a thickness direction thereof and electrically connecting the pad and the wiring conductor together; and a dummy via conductor penetrating through the resin layer in the thickness direction thereof without electrically connecting the pad and the wiring conductor together, wherein the via conductor and the dummy via conductor are arranged immediately below each of the pads, the pads include a first pad with at least one of the dummy via conductors arranged immediately therebelow, and a second pad with only the via conductor arranged immediately therebelow, and wherein a total amount of the dummy via conductors and a quantity of the via conductors formed immediately below the first pad is equal to an amount of the via conductors formed immediately below the second pad.

2. The wiring board according to claim 1,
wherein the plurality of wiring conductors include a first wiring conductor electrically connected to the first pad, and a second wiring conductor positioned in a layer different from a layer in which the first wiring conductor is positioned and electrically connected to the second pad.

3. The wiring board according to claim 1,
wherein the first dummy via conductor and the first via conductor formed immediately below the first pad are distanced away from each other with the resin layer interposed therebetween.

4. The wiring board according to claim 1,
wherein the first dummy via conductor and the first via conductor formed immediately below the first pad are electrically connected to each other.

5. The wiring board according to claim 1,
wherein either the first dummy via conductor, or the first dummy via conductor and the first via conductor are formed in each of all the resin layers immediately below the first pad.

6. The wiring board according to claim 2,
wherein the first wiring conductor is positioned in the same layer as the first pad, and the via conductor is not formed immediately below the first pad.

7. A probe card comprising:
the wiring board according to claim 1; and
the plurality of probes individually connected to the plurality of pads.

* * * * *